United States Patent [19]

Hamakawa et al.

[11] 4,271,328
[45] Jun. 2, 1981

[54] PHOTOVOLTAIC DEVICE

[75] Inventors: Yoshihiro Hamakawa, 17-4,MInamihanayashiki 3-chome, Kawanishi-shi, Hyogo-ken; Hiroaki Okamoto, Kobe; Yoshiteru Nitta, Osaka; Toshio Adachi, Toyonaka, all of Japan

[73] Assignee: Yoshihiro Hamakawa, Kawanishi, Japan

[21] Appl. No.: 130,536

[22] Filed: Mar. 14, 1980

[30] Foreign Application Priority Data

Mar. 20, 1979 [JP] Japan .................. 54/32993

[51] Int. Cl.³ .......................................... H01L 31/06
[52] U.S. Cl. .................................. 136/249; 136/258; 357/2; 357/30
[58] Field of Search .......... 136/89 MS, 89 TF, 89 SJ, 136/249, 258; 357/2, 30

[56] References Cited

U.S. PATENT DOCUMENTS

| 4,015,280 | 3/1977 | Matsushita et al. .................. 357/30 |
| 4,206,002 | 6/1980 | Sabnis et al. .................. 136/89 MS |

OTHER PUBLICATIONS

V. L. Dalal, "Design Considerations For a-Si Solar Cells", *IEEE Trans. Electron Devices*, vol. ED-27, pp. 662-670 (1980).
D. E. Carlson et al., "Amorphous Thin Films For Solar-Cell Applications", Quarterly Report No. 3, Jul. 1979, ReA Labs, Princeton, N.J., for Department of Energy, SAN-2219-3, pp. 69-75.
J. J. Hanak, "Monolithic Solar Cell Panel of Amorphous Silicon", *Solar Energy*, vol. 23, pp. 145-147 (1979).
Y. Marfaing, "Evaluation of Multijunction Structures Using Amorphous Si-Ge Alloys", Proceedings, 2nd European Community Photovoltaic Solar Energy Conference, Berlin, Apr. 23-26, 1979, Reidel Pub. Co. (1979), pp. 287-294.
Y. Hamakawa et al., "A New Type of Amorphous Silicon Photovoltaic Cell Generating More Than 2.0V", *Appl. Phys. Lett.*, vol. 35, pp. 187-189 (1979).

*Primary Examiner*—Aaron Weisstuch
*Attorney, Agent, or Firm*—Staas & Halsey

[57] ABSTRACT

A photovoltaic device including a plurality of amorphous silicon unit cells each having a p-i-n structure layered in succession on a substrate made of stainless steel. A transparent electrically conductive layer, for withdrawing a photoelectromotive force in cooperation with the electrically conductive substrate, is formed on the uppermost unit cell, so that rays of light may be incident upon the photovoltaic device from the uppermost unit cell. Preferably, the thickness of the unit cells closer to the light incidence surface is selected to be less than the thickness of the unit cells farther from the light incident surface. Each of the unit cells is structured such that the n type, i type and p type layers are disposed in the above described order from the light incidence surface in terms of the impurity type.

19 Claims, 9 Drawing Figures

NUMBER OF AMORPHOUS SILICON UNIT CELLS

PHOTOVOLTAIC DEVICE

BACKGROUND OF THE INVENTION

1. Field of the Invention

The present invention relates to a photovoltaic device. More specifically, the present invention relates to a photovoltaic device such as a solar cell employing amorphous silicon.

2. Description of the Prior Art

Solar cells employing various kinds of semiconductor materials have been heretofore proposed and put into practical use. Such solar cells utilize a single crystal or polycrystal semiconductor material such as Si, GaAs, CdS, CdTe or the like and employ a p-n junction, a heterojunction or a Schottky barrier. Recently it was observed that amorphous silicon obtained by glow discharge decomposition of silane ($SiH_4$) makes it possible to control the conductivity type by doping of a substitutional impurity. Ever since this observation attention has been focused on this process as a process for inexpensively manufacturing solar cells which meet the demand of development of a substitute energy source. Several disclosures have been made of an amorphous solar cell manufactured using a glow discharge, for example, in U.S. Pat. No. 4,064,521 issued Dec. 20, 1977 to Carlson. These disclosures have employed a junction similar to that of conventional solar cells.

However, in the above-described solar cells, an open-circuit voltage $V_{oc}$ withdrawn from a solar cell unit including a single p-n junction is determined by the energy gap of the semiconductor material used in forming the junction. For example, in the case of a silicon solar cell, a voltage of approximately 0.6 V is obtained and in the case of a GaAs solar cell, a voltage of approximately 0.8 V is obtained, while the open-circuit voltage $V_{oc}$ is no higher than 1 V. However, a higher open circuit voltage output is often required in actual applications of such cells. A conventional approach, which was employed for generating a higher voltage output, was that a plurality of solar cell units were fabricated and then externally connected in series. Although various proposals concerning a means for connecting solar cell units in series have been made, disadvantages have been encountered in that the package cost is high in manufacturing facilities and process and the cells are large.

SUMMARY OF THE INVENTION

The present invention comprises a photovoltaic device including a plurality of unit cells each including amorphous silicon layers having a p-i-n structure layered in succession on an electrically conductive substrate. An electrically conductive layer is further formed on the uppermost unit cell, so that there is a photoelectromotive force between the electrically conductive substrate and the above described electrically conductive layer.

Since a single device is structured through lamination of a plurality of unit cells in accordance with the present invention, a voltage obtainable from a single device can be considerably increased as compared with the prior art devices. As a result, the usefulness of a photovoltaic device employing amorphous silicon can be enhanced. Furthermore, since a laminated structure is very simple, a device which is capable of producing a higher voltage can be fabricated very easily. The photovoltaic device of the present invention can produce a higher voltage from a single device with a higher energy conversion efficiency.

In a preferred embodiment of the present invention, the thickness of the respective unit cells as layered is selected such that the number of photons absorbed in the respective unit cells may be the same. For example, the thickness of the unit cells closer to the light incident surface is selected to be less than the thickness of the unit cells farther from the light incident surface. This embodiment makes it possible to design with ease the inventive photovoltaic device which achieves the highest energy conversion efficiency with respect to any type of light source.

Accordingly, a principal object of the present invention is to provide a single photovoltaic device which is capable of producing a high voltage.

Another object of the present invention is to provide a single photovoltaic device which is capable of a higher voltage and a higher energy conversion efficiency than prior art devices.

A further object of the present invention is to provide a photovoltaic device capable of producing a higher voltage than prior art devices which can be easily and inexpensively fabricated.

Still a further object of the present invention is to provide a photovoltaic device which can attain optimum energy conversion efficiency with respect to any type of light source.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B are graphs showing the band structure of the photovoltaic device of the present invention, wherein FIG. 3A illustrates the band structure of the device in a dark state and FIG. 3B illustrates the band structure of the device in an illuminated state;

DESCRIPTION OF THE PREFERRED EMBODIMENTS

Figure 1:
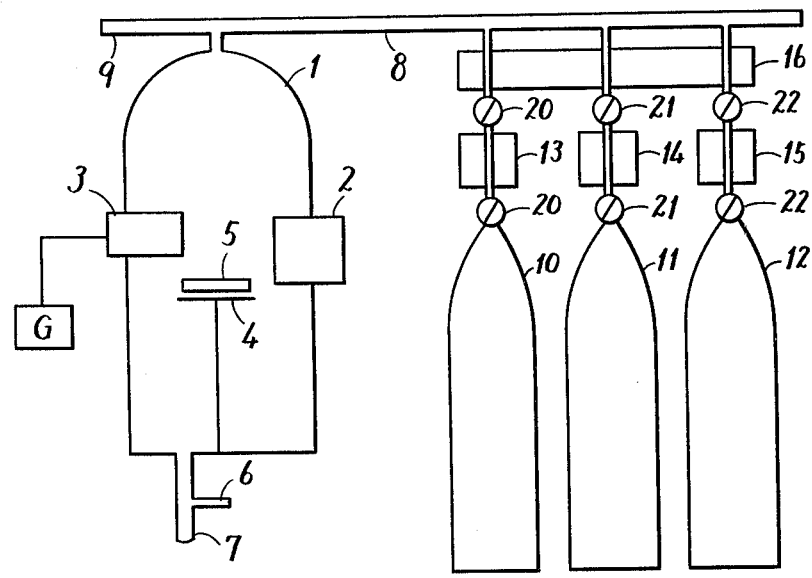
FIG. 1 is a diagram of an apparatus for use in manufacturing the photovoltaic device of the present invention.

FIG. 1 is a diagram of an apparatus for use in manufacturing the amorphous silicon photovoltaic device of the present invention. Referring to FIG. 1, reference numeral 1 denotes a reaction chamber, reference numeral 2 denotes a discharge cathode, reference numeral 3 denotes a discharge anode, reference numeral 4 denotes a heating turntable, reference numeral 5 denotes a substrate, reference numeral 6 denotes a pipe for connection to a vacuum meter, reference numeral 7 denotes an exhaust gas port, reference numeral 8 denotes a source material gas supply pipe, reference numeral 9 denotes a pipe for connection to a vacuum source, reference numerals 10, 11 and 12 denote gas tanks, reference numerals 13, 14 and 15 denote flow meters, reference numeral 16 denotes a cold trap, and reference numerals 20, 21 and 22 denote valves.

An example of the operation of the manufacturing apparatus will be described below. At the outset, an exhaust pump connected to the exhaust gas port 7 is driven so that the reaction chamber 1 is evacuated to approximately $10^{-6}$ Torr and then the heating turntable 6 is driven, so that the substrate 5 placed thereon is heated while being rotated. Shortly before or after the heating operation, the valves 20 and 21 are opened, so that a gas mixtures of $SiH_4/H_2$ and a $PH_3/H_2$ are supplied to the reaction chamber 1 from the gas tanks 10 and 11, respectively. Then a discharge generator G is driven so that a high frequency electric field is applied to the above described gases, whereby a glow discharge is generated between the discharge anode and cathode 3 and 2. After an n type amorphous silicon layer is deposited on the substrate 5, the discharge is stopped and shortly before or after that the valves 20 and 21 are closed to discontinue the supply of the gases, while the source material gases remaining in the reaction chamber 1 are evacuated.

Then the valve 20 is opened so that the gas mixture of $SiH_4/H_2$ is supplied from the gas tank 10 to the reaction chamber 1, whereby the glow discharge is restarted. An i (intrinsic) type amorphous silicon layer is thus deposited on the n type layer, whereupon the glow discharge is stopped and shortly before or after that the valve 20 is closed to discontinue the supply of the source material gas, while the source material gas remaining in the reaction chamber 1 is evacuated.

Then the valves 20 and 22 are opened, so that the gas mixtures of the $SiH_4/H_2$ and $B_2H_6/H_2$ are supplied to the reaction chamber 1 from the gas tanks 10 and 12, respectively, and the glow discharge is restarted. A p type amorphous silicon layer is thus deposited on the i type layer and then the glow discharge is stopped. Shortly before or after that the valves 20 and 22 are closed to discontinue the supply of the source material gases, while the source material gases remaining in the chamber are evacuated. A composite including the n type, i type and p type amorphous silicon layers thus obtained is generally referred to as an amorphous silicon unit cell. Thereafter further similar sets of n type, i type and p type amorphous silicon layers are deposited in succession, so that two or more amorphous silicon unit cells are formed.

Then a transparent electrically conductive layer of indium tin oxide or the like is formed on the p type amorphous silicon layer of the final amorphous silicon unit cell by the well-known electron beam evaporation process, RF sputtering or the like. However, an apparatus for performing this step is not illustrated. An amorphous silicon photovoltaic device, having a multi-layered cell structure including two or more unit cells each having an amorphous silicon unit cell plus a transparent electrically conductive layer laminated in succession on the substrate 5, is fabricated in accordance with the above described process. The device is adapted so that rays of light may be incident upon the device through the transparent electrically conductive layer.

One embodiment of the present invention will be described next. The substrate 5 may be, for example, a plate of stainless steel 0.5 mm thick and $20 \times 20$ mm in size having a mirror polished surface. The relative volume parts of the source material gases may be $SiH_4/H_2 = 0.1$, $PH_3/H_2 = 5 \times 10^{-4}$, and $B_2H_6/H_2 = 5 \times 10^{-4}$, and the volume mixture ratios of these gas mixtures are on the order of 0.1 to 1% for any of the gas mixtures of $PH_3/H_2$ and the gas mixture of $B_2H_6/H_2$ to the gas mixture of $SiH_4/H_2$. When the pressure of the source material gases in the reaction chamber is selected to be 2 to 5 Torr, the high frequency output of the discharge generator G is selected to be 50 to 500 W (4 MHz) and the temperature of the stainless steel substrate is selected to be 250° to 350° C. The growth rates of the p type and n type amorphous silicon layers are 0.4 to 1 Å/sec, and the growth rate of the i type amorphous silicon layer is 0.8 to 3 Å/sec. The thickness of the amorphous silicon layers can be readily adjusted by adjusting the deposition time period.

Figure 2:
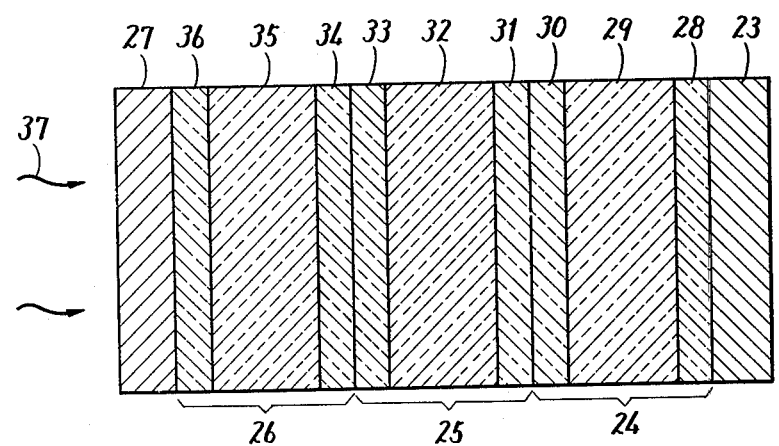
FIG. 2 is a sectional view showing one embodiment of the photovoltaic device of the present invention.

FIG. 2 is a sectional view showing one example of the structure of the photovoltaic device of the present invention in the case where the number of amorphous silicon unit cells is three. Referring to FIG. 2, reference numeral 23 denotes a stainless steel substrate, reference numerals 28, 29 and 30 denote the n type, i type and p type amorphous silicon layers of a first amorphous silicon unit cell 24, respectively, reference numerals 31, 32 and 33 denote the n type, i type and p type amorphous silicon layers of a second amorphous silicon unit cell 25, respectively, reference numerals 34, 35 and 36 denote the n type, i type and p type amorphous silicon layers of a third amorphous silicon unit cell 26, respectively, reference numeral 27 denotes a transparent electrically conductive film, and reference numeral 37 denotes solar rays.

Figure 3:
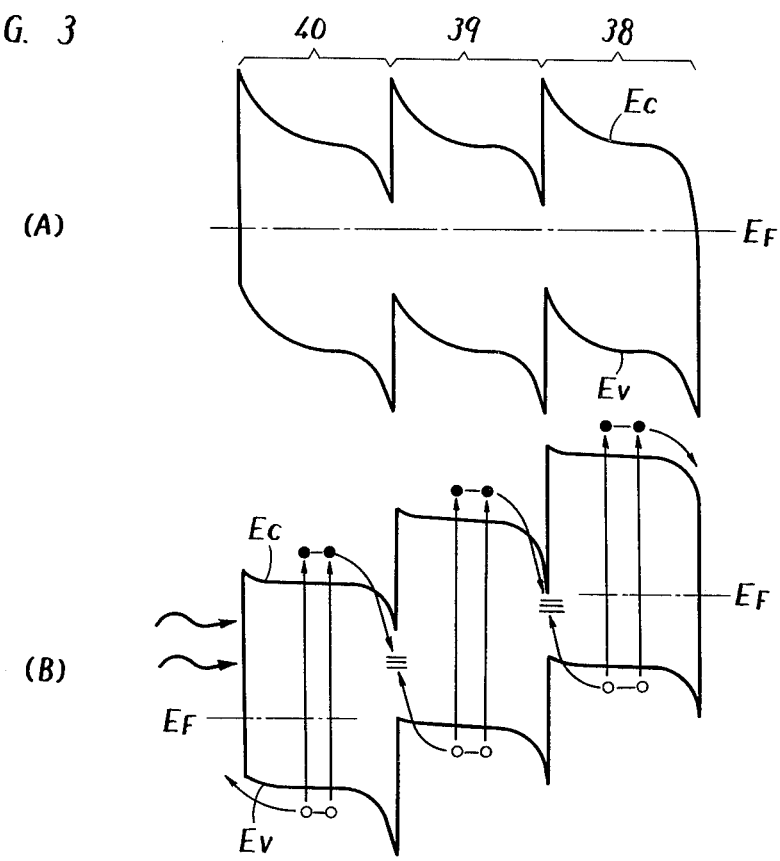
Figure 4:
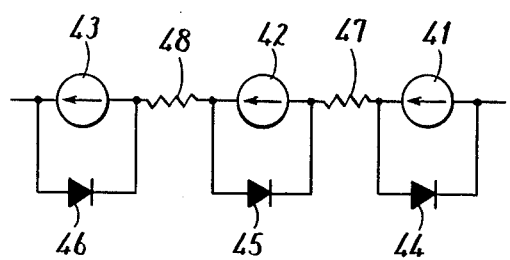
FIG. 4 is a diagram of an equivalent circuit of the photovoltaic device of the present invention.

FIG. 3A shows the band structure of the FIG. 2 photovoltaic device, having the three amorphous silicon unit cells, in the case of no incidence of radiation. Reference character Ec denotes the lower end of the conduction band, reference character Ev denotes the upper end of the valence band, reference character Ef denotes the Fermi level, and reference numerals 38, 39 and 40 denote the portions corresponding to the first, second and third amorphous silicon unit cells 24, 25 and 26 in FIG. 2, respectively. However, referring to FIG. 3A, the substrate 23 of the stainless steel and the transparent electrically conductive film 27 have not been illustrated. If and when the rays, such as solar rays, are incident upon the photovoltaic device on the surface of the third amorphous silicon unit cell, the band structure becomes that shown in FIG. 3B. Pairs of electrons and holes are generated in the respective amorphous silicon unit cells and are separated by virtue of the internal electric field, so that the holes move toward the light incident surface and the electrons move in the opposite direction. However, the p-n junction employing the doped layers of the amorphous silicon exhibits very little rectifying property and the current flowing through the junction is primarily based on the process of generation and recombination rather than the process of diffusion. Accordingly, the current flowing between the adjacent amorphous silicon unit cells is constituted only by recombination current in the p-n junctions. Therefore, an equivalent circuit of the FIG. 2 photovoltaic device may be as illustrated as shown in FIG. 4. Referring to FIG. 4, reference numerals 41, 42 and 43 denote current sources, reference numerals 44, 45 and 46 denote rectifiers, and reference numerals 47 and 48 denote resistors. Thus, the effect of connecting the amorphous silicon unit cells in series is attained. More specifically, the open-circuit voltage Voc of the amorphous silicon photovoltaic device of the present invention having a multi-layered cell structure, becomes the sum of the open-circuit voltage of the respective amorphous silicon unit cells. As a result an overall open-circuit voltage as high as approximately the unit cell number times the open circuit voltage of a single amorphous unit cell structure is attained. However, the short-circuit light current Isc of the device of the present invention approximately corresponds to the minimum value of the short-circuit light currents of the respective amorphous silicon unit cells. In contrast, in prior art solar cells of a multi-layered structure such as disclosed in Japanese Laid Open Patent Application No. 46888/1976 laid open Apr. 21, 1976 the open-circuit voltage which is provided is substantially the same as that of a single layered solar cell structure. In this context, the present invention is essentially distinguishable from the prior art.

The above referenced Japanese Laid Open Patent Application No. 46888/1976 discloses a particular multi-layered structure for enhancing energy conversion efficiency by reducing a diffusion current component for recombining the pairs of electrons and holes generated by the rays of light among the carriers (including a drift current component and a diffusion current component) flowing through the p-n junctions. However, the purpose of implementing the device in a multi-layered structure in the above referenced Japanese Laid Open Patent Application and even the structure thereof are essentially different from the present invention.

In addition to the above described embodiment of the photovoltaic device having three amorphous silicon unit cells as shown in FIG. 2, further prototype devices having two, four, five and ten amorphous silicon unit cells in accordance with the present invention and a sample of a photovoltaic device having a single amorphous silicon unit cell for comparison were fabricated in accordance with the above described process. As for all the prototypes, the thickness of the n type amorphous silicon layer was selected to be 100 to 200 Å, the thickness of the p type amorphous silicon layer was selected to be 20 to 50 Å, and the thickness of the i type amorphous silicon layer was selected to be the value shown in Table I for the respective prototypes.

TABLE I

| Number of Amorphous Silicon Unit | 1 | 2 | 3 | 4 | 5 | 10 |
|---|---|---|---|---|---|---|
| Thickness of i Type Layer (Å) | 5000~7000 | 2000~3000 | 1000~2000 | 800~1500 | 500~1200 | 100~700 |

Figure 5:
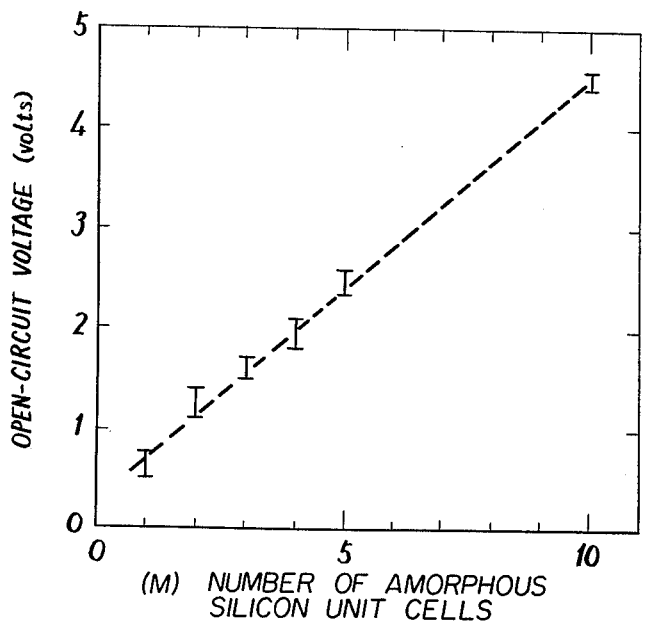
FIG. 5 is a graph illustrating one example of the characteristics of the photovoltaic device of the present invention.

The open-circuit voltage characteristics of the photovoltaic devices of the present invention fabricated in a multi-layered cell structure when solar rays of 80 mW/cm$^3$ impinge thereon is shown in FIG. 5, wherein the abscissa indicates the number(m) of amorphous silicon unit cells and the ordinate indicates the open-circuit voltage Voc of the respective prototypes. As is apparent from FIG. 5, the open-circuit voltage Voc increases in approximate proportion to the number of amorphous silicon unit cells laminated in the photovoltaic device.

As described in the foregoing, according to the present invention, a photovoltaic device is provided which generates a higher open-circuit voltage and which can be easily fabricated through the successive and simple operation of gas flow valves. On the other hand, in the case where the thicknesses of the respective amorphous silicon unit cells are all substantially the same as described previously, the greater the number of amorphous silicon unit cells the less the short-circuit light current Isc and the less the energy conversion efficiency. This means that such a device is not suitable as an energy source such as a battery, although the same can be satisfactorily used as a signal source such as a photodetector or the like. Therefore, a detailed description will be made of a preferred embodiment of the present invention which avoids reduction of the energy conversion effeciency without reducing the short-circuit light current very much.

As described previously, in the case of an amorphous silicon photovoltaic device of a multi-layered cell structure, the current which is externally withdrawn is restricted to the minimum value of the light currents of the respective amorphous silicon unit cells. Therefore, in order to obtain the largest possible light current, it is necessary to determine the thickness of the respective amorphous silicon unit cells so that the number of photons absorbed in the respective amorphous silicon unit cells may be the same.

Figure 6:
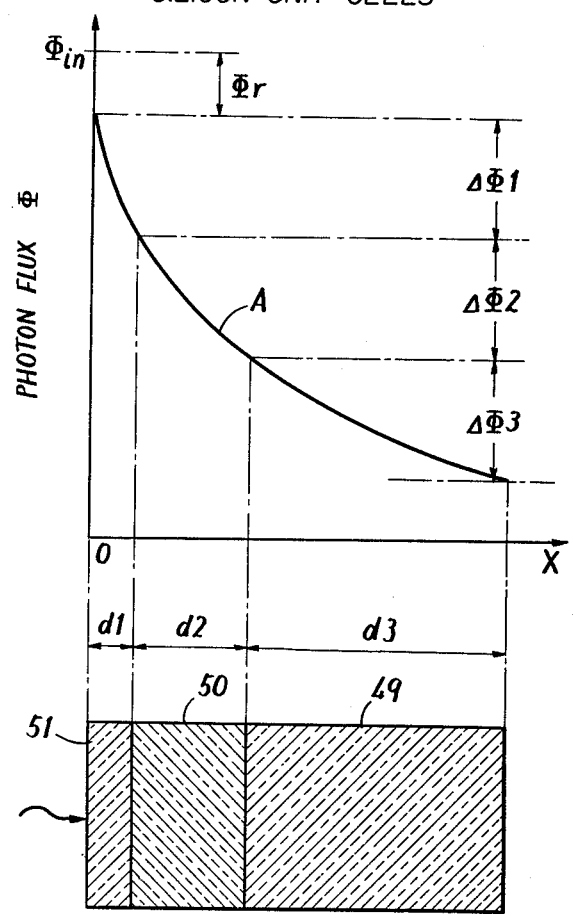
FIG. 6 is a graph depicting a design principle of the photovoltaic device of the present invention.

Since a four layer structure, comprising the substrate, the amorphous silicon layer portion, the surface transparent conductive layer and air, is involved in a photovoltaic device having the multi-layered amorphous silicon cell structure of the present invention, a relative photon flux in an arbitrary position in the amorphous silicon layer portion with respect to an incident luminous flux of a given wavelength can be evaluated by Maxwell's electromagnetic equation using these optical parameters. In addition, the photon flux within the amorphous silicon layer portion with respect to an imaginary light source, such as the solar rays, can be evaluated by integration using a photon number distribution in a wavelength region shorter than the wavelength ($\sim 7000$ Å) corresponding to the forbidden band ($\sim 1.7$ eV) of the amorphous silicon in the spectrum of the above described imaginary light source. FIG. 6 diagrammatically shows such a relationship. FIG. 6 illustrates the relationship between the photon flux $\Phi$ (curve A) and the position x in the amorphous silicon layer portion from the light incident surface. FIG. 6 also illustrates a sectional view of a corresponding amorphous silicon layer for the case where the number of the amorphous silicon unit cells is three. The photon flux $\Phi$ at the position x in the amorphous silicon layer portion contains a reflection loss $\Phi r$ with respect to the photon flux $\Phi in$ incident upon the amorphous silicon layer portion. The deeper in the amorphous silicon layer the less the photon flux as illustrated by curve A. Therefore, the thickness of the respective amorphous silicon unit cells is preferably selected such as d1, d2, and d3 in turn, so that the photon numbers $\Delta\Phi 1$, $\Delta\Phi 2$ and $\Delta\Phi 3$ absorbed in the respective amorphous silicon unit cells 49, 50 and 51 may be the same.

In order that the respective amorphous silicon unit cells each operate as a single p-i-n type amorphous silicon photovoltaic cell, each single cell must be thicker than approximately 100 Å, but selection of a thickness larger than 1 $\mu$m merely increases the series resistance loss and hence merely reduces performance of the amorphous silicon unit cell. Therefore, the thickness of each of the amorphous silicon unit cells is preferably selected to be from approximately 100 Å approximately 1 μm.

In designing an amorphous silicon multi-layered cell photovoltaic device including a plurality (m) of amorphous silicon unit cells, assuming that the thickness of the amorphous silicon unit cell farthest from the light incident surface is 5000 to 7000 Å as described previously, that the number of photons absorbed therein is $\Delta\Phi m$, and that the amorphous silicon unit cells are denoted as 1, 2, ... k, ... m from the light incident surface, then the thickness of the respective amorphous silicon layers and the total thickness of the amorphous silicon layer are preferably determined to be self-consistent, so that the following relationship may be established between the number of photons $\Delta\Phi k$ (k = 1, 2, ..., m−1) being absorbed in the respective amorphous silicon unit cell:

$$\Delta\Phi 1 = \Delta\Phi 2 = \ldots = \Delta\Phi m$$

Thus, an amorphous silicon photovoltaic device, having a multi-layered cell structure adapted to the spectrum of any given radiation such as solar radiation, a fluorescent lamp and the like, i.e. having an excellent efficiency with respect to the light source, can be easily can be designed.

Figure 7:
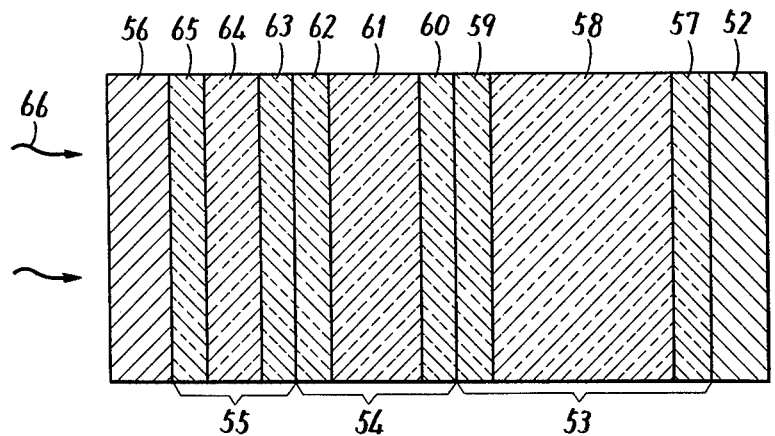
FIG. 7 is a sectional view of another embodiment of the photovoltaic device of the present invention.

FIG. 7 is a sectional view showing one example of a structure of the photovoltaic device of the present invention designed in the above described manner for the case where the number of amorphous silicon unit cells is three, wherein reference numeral 52 denotes a stainless steel substrate, reference numerals 57, 58 and 59 denote n type, i type and p type amorphous silicon layers of a first amorphous silicon unit cell 53, reference numerals 60, 61 and 62 denote n type, i type and p type amorphous silicon layers of a second amorphous silicon unit cell 54, reference numerals 63, 64 and 65 denote n type, i type and p type amorphous silicon layers of a third amorphous silicon unit cell 55, reference numeral 56 denotes a transparent electrically conductive layer, and reference numeral 66 denotes solar rays.

In addition to the above-described embodiment shown in FIG. 7 for the case where the number of amorphous silicon unit cells is three, additional embodiments where the number of amorphous silicon unit cells is 2, 4 and 5, and another prototype having a single amorphous silicon unit cell for comparison, were fabricated in accordance with the above described process. As for all of these embodiments, the thickness of the n type amorphous silicon layer was selected to be 100 to 200 Å, the thickness of the p type amorphous silicon layer was selected to be 20 to 50 Å, and the thickness of the i type amorphous silicon layer in the respective prototypes was selected in accordance with Table II.

TABLE II

| Number of Unit Cells | Thickness of i type layer (Å) | | | | |
|---|---|---|---|---|---|
| | 1 | 2 | 3 | 4 | 5 |
| Number of Amorphous Silicon Unit Cell | | | | | |
| 1 | 5500 | — | — | — | — |
| 2 | 500 | 5500 | — | — | — |
| 3 | 400 | 900 | 5000 | — | — |
| 4 | 200 | 450 | 1400 | 5500 | — |
| 5 | 100 | 300 | 700 | 1700 | 5000 |

Figure 8:
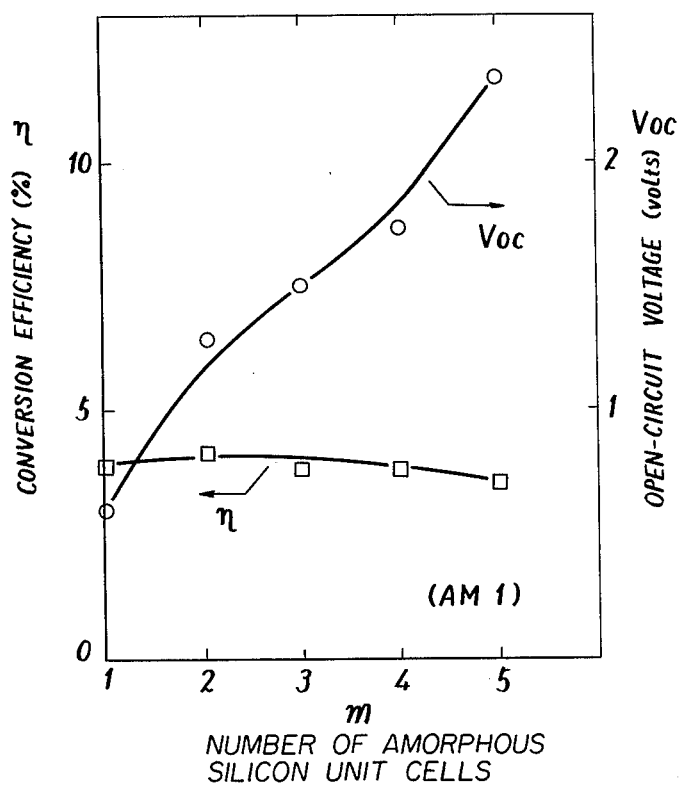
FIG. 8 is a graph showing the characteristics of the photovoltaic device of the present invention.

The characteristic of the FIG. 2 photovoltaic device, when solar rays of 80 mW/cm$^3$ impinge thereon, is shown in FIG. 8, wherein the abscissa indicates the number(m) of the amorphous silicon unit cells and the ordinate indicates the open-circuit voltage Voc and the energy conversion effeciency $\eta$ of the respective prototypes. As is apparent from FIG. 8, when the thickness of the respective amorphous silicon unit cells is selected to be gradually increasing from the light incident surface, so that the number of photons absorbed in the respective amorphous silicon unit cells is the same and the light current in the respective amorphous silicon unit cells is the same, the open-circuit voltage Voc increases in approximate proportion to the number of amorphous silicon unit cells without significant reduction of the energy conversion efficiency.

Since the internal electric field is predominantly generated in the region of the i type layer close to the p type layer in the case of a p-i-n structure photovoltaic device, it is necessary that more electrons and holes be generated in that region in order that increased light current may be obtained. Furthermore, since the electrons and holes, generated in the vicinity of the n type layer, must be diffused to a region where the internal electric field exists, an increased loss results. Accordingly, it is desired that the light rays be adapted to impinge on the device from the p type layer.

Although the foregoing embodiment was described as having the n type, i type and p type amorphous silicon layers formed in turn on the substrate, conversely, a similar result can be attained by forming in turn the p type, i type and n type amorphous silicon layers on a substrate. Although in the foregoing the substrate was described as comprising a stainless steel plate, the substrate may be a composite of a transparent electrically conductive film deposited on a glass plate or a film-like transparent electrically conductive material, or the like. Likewise the electrically conductive layer may be formed on the amorphous silicon layer using metal. In forming an amorphous silicon layer on a transparent electrically conductive film, sometimes the transparent electrically conductive film deteriorates or an amorphous silicon layer of good quality cannot be obtained. In such a case an electrically conductive substrate of, for example, stainless steel, or other metal m may be used.

In addition, H$_2$ may be replaced by Ar as the above-described gas mixture and SiF$_4$+H$_2$ may be used as the gas mixture.

Furthermore, an ion plating process, a sputtering process or the like, in addition to the above-described processes may be employed as a process for forming an amorphous silicon layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device, comprising:
   a substrate comprising an electrically conductive material, said substrate having a surface;
   a plurality of photoelectric converting unit cells laminated in succession on the surface of said substrate, each of said plurality of photoelectric converting unit cells including amorphous silicon layers comprising a p type layer, an i type layer and an n type layer; and an electrically conductive layer formed on the one of said plurality of photoelectric converting unit cells which is furthest from the surface of said substrate, one of said substrate and said electrically conductive layer comprising a radiation incident surface adapted for receiving radiation.

2. A photovoltaic device in accordance with claim 1, wherein the thickness of each of said plurality of photoelectric converting unit cells is selected to be substantially the same.

3. A photovoltaic device in accordance with claim 1, wherein the thickness of each of said plurality of photoelectric converting unit cells is selected to be different.

4. A photovoltaic device in accordance with claim 3, wherein the thickness of said plurality of photoelectric converting unit cells closest to said radiation incident surface of said device is selected to be less than the thickness of the remaining ones of said plurality of photoelectric converting unit cells.

5. A photovoltaic device in accordance with claim 4, wherein the thickness of said plurality of photoelectric converting cells increases the further the photoelectric converting unit cell is from said radiation incident surface.

6. A photovoltaic device in accordance with claim 1, 2, 3, 4 or 5, wherein said electrically conductive layer comprises a radiation transparent material such that said electrically conductive layer is said radiation incident surface, and wherein said device is adapted to receive radiation from the one of said plurality of photoelectric converting unit cells which is closest to said electrically conductive layer.

7. A photovoltaic device in accordance with claim 1, 2, 3, 4 or 5, wherein said amorphous silicon layers of each of said plurality of photoelectric converting unit cells comprise an n type layer formed closest to said radiation incident surface, an i type layer formed on said n type layer, and a p type layer formed on said i type layer.

8. A photovoltaic device in accordance with claim 1, 2, 3, 4 or 5, wherein said amophous silicon layers of each of said plurality of photoelectric converting unit cells comprise a p type layer formed closest to said radiation incident surface, an i type layer formed on said p type layer, and an n type layer formed on said i type layer.

9. A photovoltaic device in accordance with claim 1, 2, 3, 4 or 5, wherein said substrate comprises an insulating substrate and an electrically conductive film formed on said insulating substrate.

10. A photovoltaic device in accordance with claim 9, wherein said insulating substrate and said electrically conductive film are both radiation transparent such that said substrate is said radiation incident surface, and wherein said device is adapted to receive radiation through said substrate.

11. A photovoltaic device, comprising:
a substrate comprising an electrically conductive material, said substrate having a surface;
a first photoelectric converting unit cell, having a surface, formed on the surface of said substrate;
a second photoelectric converting unit cell, having a surface, formed on the surface of said first photoelectric converting unit cell;
an electrically conductive layer formed on the surface of said second photoelectric converting unit cell;
said electrically conductive layer comprising a radiation incident surface adpated for receiving radiation, each of said first and second photoelectric converting unit cells including amorphous silicon layers comprising a p type layer, an i type layer and an n type layer.

12. A photovoltaic device, comprising:
a substrate comprising an electrically conductive material, said substrate having an inner surface, said substrate comprising a radiation incident surface adapted for receiving radiation;
a first photoelectric converting unit cell, having a surface, formed on the inner surface of said substrate;
a second photoelectric converting unit cell, having a surface, formed on the surface of said first photoelectric converting unit cell; and
an electrically conductive layer formed on the surface of said second photoelectric converting unit cell, each of said first and second photoelectric converting unit cells including amorphous silicon layers comprising a p type layer, an i type layer and an n type layer.

13. A photovoltaic device as set forth in claim 11 or 12, wherein the thickness of said first and second photoelectric converting unit cells is selected to be substantially the same.

14. A photovoltaic device as set forth in claim 11 or 12, wherein the thickness of said first and second photoelectric converting unit cells is selected to be different.

15. A photovoltaic device as set forth in claim 11, wherein the thickness of said second photoelectric converting unit cell is less than the thickness of said first photoelectric converting unit cell.

16. A photovoltaic device as set forth in claim 12, wherein the thickness of said first photoelectric converting unit cell is less than the thickness of said second photoelectric converting unit cell.

17. A photovoltaic device as set forth in claim 11 or 15, wherein said amorphous silicon layers of said first photoelectric converting unit cell comprise:
a first n type layer formed on the surface of said substrate;
a first i type layer formed on said first n type layer; and
a first n type layer formed on said first i type layer, and wherein said amorphous silicon layers of said second photoelectronic converting unit cell comprise:
a second n type layer formed on said first p type layer;
a second i type layer formed on said second n type layer; and
a second p type layer formed on said second i type layer.

18. A photovoltaic device as set forth in claim 12, wherein said amorphous silicon layers of said first photoelectric converting unit cell comprise:
a first p type layer formed on the surface of said substrate;
a first i type layer formed on said first p type layer; and
a first n type layer formed on said first i type layer, and wherein said amorphous silicon layers of said second photoelectric converting unit cell comprise:

a second p type layer formed on said first n type layer;

a second i type layer formed on said second p type layer; and a second n type layer formed on said second i type layer.

19. A photovoltaic device as set forth in claim 11, 12, 15 or 16, wherein said substrate comprises an insulating substrate and an electrically conductive film formed on said insulating substrate.

* * * * *

UNITED STATES PATENT AND TRADEMARK OFFICE
CERTIFICATE OF CORRECTION

PATENT NO. : 4,271,328
DATED : June 2, 1981
INVENTOR(S) : YOSHIHIRO HAMAKAWA ET AL.

It is certified that error appears in the above—identified patent and that said Letters Patent is hereby corrected as shown below:

```
Front Page, [75], "MInamihanayashiki" should be
         --Minamihanayashiki--.
Front Page, [56], References Cited, Carlson et al., "ReA"
         should be --RCA--.
Front Page, [57], Abstract, lines 11 and 15, "incidence"
         should be --incident--.
Col. 1, line 29, "cells," should be --cell,--.
Col. 2, line 10, "possible" should be --easy--, and delete
         "with ease the";
        line 11, "inventive" should be --a--.
Col. 3, line 17, "a gas" should be --gas--, and "and a"
         should be --and--.
Col. 4, line 59, "the" should be --a--;
        line 64, "by" should be --by a--;
        line 66, delete "as" (first occurrence).
Col. 5, Table I, first column, last line, "A" should be
         --Å--.
```

UNITED STATES PATENT AND TRADEMARK OFFICE
CERTIFICATE OF CORRECTION

PATENT NO. : 4,271,328

DATED : June 2, 1981

INVENTOR(S) : YOSHIHIRO HAMAKAWA ET AL.

It is certified that error appears in the above—identified patent and that said Letters Patent is hereby corrected as shown below:

Col. 6, line 5, delete "gas flow";
line 17, "effeciency" should be --efficiency--.
Col. 7, line 28, delete "can be";
Table II, second heading, line 1, "(A)" should be --(Å)--.
Col. 8, line 46, "metal m" should be --metal,--.
Col. 9, line 44, "amophous" should be --amorphous--.
Col. 10, line 5, "adpated" should be --adapted--;
line 50, "n type" should be --p type--.

Signed and Sealed this

Twentieth Day of October 1981

[SEAL]

Attest:

GERALD J. MOSSINGHOFF

*Attesting Officer*   *Commissioner of Patents and Trademarks*